United States Patent
Zhang et al.

(10) Patent No.: US 11,058,014 B1
(45) Date of Patent: Jul. 6, 2021

(54) METHOD OF MANUFACTURING CIRCUIT BOARD WITH EMBEDDED CONDUCTIVE CIRCUITS

(71) Applicants: Avary Holding (Shenzhen) Co., Limited., Shenzhen (CN); HongQiSheng Precision Electronics (QinHuangDao) Co., Ltd., Qinhuangdao (CN)

(72) Inventors: Xiao-Yan Zhang, Shenzhen (CN); Han-Pei Huang, Hsinchu (TW)

(73) Assignees: Avary Holding (Shenzhen) Co., Limited., Shenzhen (CN); HongQiSheng Precision Electronics (QinHuangDao) Co., Ltd., Qinhuangdao (CN)

( * ) Notice: Subject to any disclaimer, the term of this patent is extended or adjusted under 35 U.S.C. 154(b) by 0 days.

(21) Appl. No.: 17/038,282

(22) Filed: Sep. 30, 2020

(30) Foreign Application Priority Data

Sep. 9, 2020 (CN) .......................... 202010943557.4

(51) Int. Cl.
*H05K 3/46* (2006.01)
*H05K 3/04* (2006.01)
*H05K 3/24* (2006.01)

(52) U.S. Cl.
CPC ........... *H05K 3/4608* (2013.01); *H05K 3/048* (2013.01); *H05K 3/247* (2013.01); *H05K 3/465* (2013.01)

(58) Field of Classification Search
CPC ...... H05K 3/048; H05K 3/247; H05K 5/4608; H05K 3/465
See application file for complete search history.

(56) References Cited

U.S. PATENT DOCUMENTS

| | | | | |
|---|---|---|---|---|
| 5,600,103 A | * | 2/1997 | Odaira ................. | H05K 3/4069 174/255 |
| 6,884,709 B2 | * | 4/2005 | Iijima .................. | H05K 3/4038 438/613 |
| 7,189,302 B2 | * | 3/2007 | Hwang ................ | H05K 3/0097 156/150 |
| 7,320,173 B2 | * | 1/2008 | Lee ........................ | H05K 3/423 174/261 |
| 7,473,992 B2 | * | 1/2009 | Ogawa ................ | H01L 21/4857 257/678 |
| 10,398,026 B2 | * | 8/2019 | Goto .................... | H05K 3/4652 |

* cited by examiner

*Primary Examiner* — Carl J Arbes
(74) *Attorney, Agent, or Firm* — ScienBiziP, P.C.

(57) ABSTRACT

A method for manufacturing a circuit board with embedded conductive circuits includes providing a first circuit substrate having a first support board and a first peelable film, providing a second circuit substrate having a second support board and a second peelable film, providing an insulating layer to obtain an intermediate body, pressing the intermediate body, and removing the first support board, the first peelable film, the second support board, and the second peelable film. The first circuit substrate includes a first circuit layer. The second circuit substrate includes a second circuit layer. The first circuit layer is electrically coupled to the second circuit layer through the insulating layer.

12 Claims, 10 Drawing Sheets

METHOD OF MANUFACTURING CIRCUIT BOARD WITH EMBEDDED CONDUCTIVE CIRCUITS

FIELD

The subject matter herein generally relates to circuit boards, and more particularly to a method of manufacturing a circuit board with embedded conductive circuits.

BACKGROUND

Embedded circuit boards include conductive circuits embedded in an insulating layer. In the related art, the conductive circuits of the embedded circuit board are usually made by first opening a circuit slot in the insulating layer with a laser, then electroplating conductive material in the circuit slot, and finally etching part of the conductive material on the surface of the insulating layer.

However, electroplating of the conductive material tends to make a thickness of the conductive material uneven, and when the conductive material is subsequently etched, an etching thickness is not easy to control, resulting in residual conductive material, which in turn leads to short circuits between conductive lines. In addition, laser drilling requires a long time and the laser cost is high.

BRIEF DESCRIPTION OF THE DRAWINGS

Implementations of the present disclosure will now be described, by way of embodiments, with reference to the attached figures.

DETAILED DESCRIPTION

Figure 1:
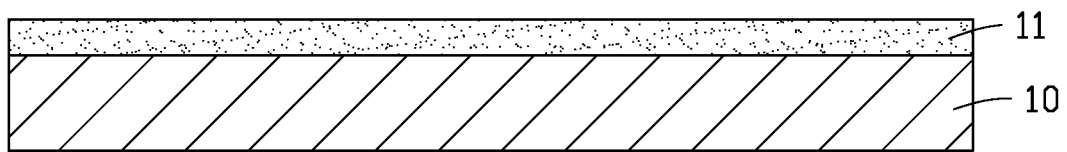
FIG. 1 is a schematic diagram of a structure after forming a first peelable film on a support board according to an embodiment of the present disclosure.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or another word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

An embodiment of the present disclosure provides a method of a circuit board with embedded conductive circuits, the method including the following steps.

In a first step, referring to FIG. 1, a first support board 10 is provided.

A first peelable film 11 is provided on one surface of the first support board 10.

The first support board 10 may be made of an organic or inorganic material, and specifically may be made of glass, polymethylmethacrylate, polyimide, silica gel, epoxy resin, and the like. In one embodiment, the first support board 10 is made of glass.

Figure 2:
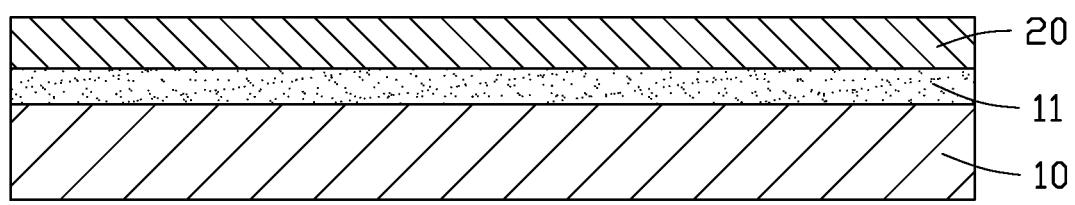
FIG. 2 is a schematic diagram of a structure after forming a first conductive paste layer on the first peelable film shown in FIG. 1.

In a second step, referring to FIG. 2, a first conductive paste layer 20 is formed on the first peelable film 11.

Specifically, a photosensitive conductive paste is printed on the first peelable film 11 and dried to form the first conductive paste layer 20.

In one embodiment, calculated in parts by weight, the photosensitive conductive paste includes 5-20 parts of a photosensitive resin polymer, 5-20 parts of a self-drying resin polymer, 0.5-5 parts of a photopolymerization initiator, 40-80 parts of conductive material, and 2-15 parts of a curing crosslinking agent.

The photosensitive resin polymer is selected from an epoxy resin, polyester resin, polyacrylic resin, polyacrylate resin, or polyurethane resin with double bonds after modification, and preferably is epoxy resin or polyester resin with double bonds after modification, and more preferably is epoxy resin with double bonds after modification.

The self-drying resin polymer is selected from thermoplastic polyurethane, acrylate polymer, or saturated polyester resin.

The photopolymerization initiator is a compound that can decompose and generate free radicals by absorbing short-wavelength light such as ultraviolet light. As a specific example, the photopolymerization initiator includes, but is not limited to, 2,4,6,-trimethylbenzoyl-diphenyl phosphorus oxide, 2-benzyl-2-(dimethylamino)-1-[4-(4-morpholinyl) phenyl]-1-butanone, and 2-methyl-1-(4-methylthiophenyl)-2-morpholine-1-propanone.

The conductive material may be at least one of silver particles, copper particles, graphene, and carbon nanotubes. The conductive material is used to make the subsequently formed conductive circuit layer conductive.

The curing crosslinking agent is selected from crosslinking agents containing reactive groups, the reactive groups including hydroxyl, carboxyl, epoxy, isocyanate, or amino groups, preferably amino or epoxy groups, and more preferably epoxy groups.

A sum of the weight parts of the above-mentioned five raw materials of the photosensitive conductive paste may be equal to 100 parts or greater than 100 parts.

Figure 3:
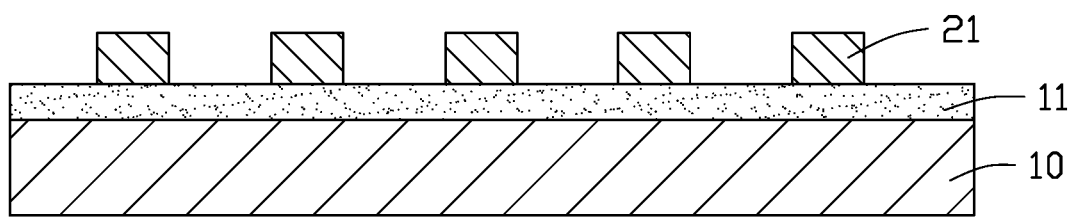
FIG. 3 is a schematic diagram of a structure of the first conductive paste layer shown in FIG. 2 after exposure and development.

In a third step, referring to FIG. 3, the first conductive paste layer 20 is exposed and developed and cured to form a first conductive circuit layer 21.

Figure 4:
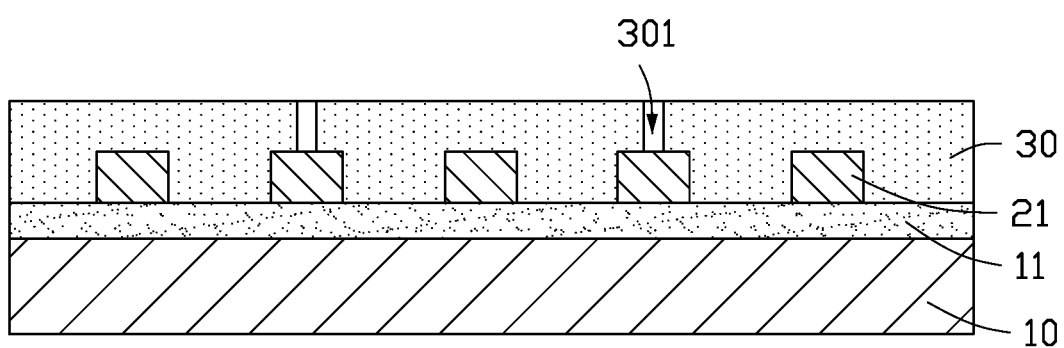
FIG. 4 is a schematic diagram of a structure after forming a dry film on the first conductive circuit layer shown in FIG. 3.

In a fourth step, referring to FIG. 4, a dry film 30 is formed on the first conductive circuit layer 21.

The dry film 30 also covers a surface of the first peelable film 11 without the first conductive circuit layer 21. A thickness of the dry film 30 is greater than a thickness of the first conductive circuit layer 21, so that the dry film 30 protrudes from the first conductive circuit layer 21. At least one opening 301 is defined in the dry film 30, and a portion of the first conductive circuit layer 21 is revealed through the opening 301.

Figure 5:
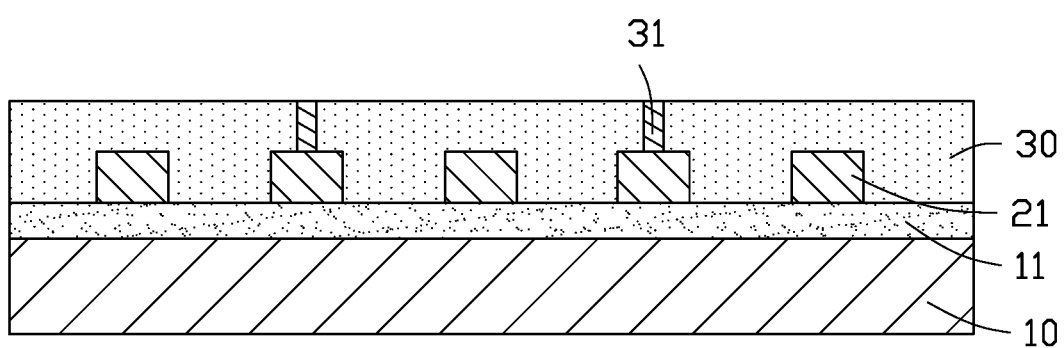
FIG. 5 is a schematic diagram of a structure after a first conductive pillar is formed in an opening shown in FIG. 4.

In a fifth step, referring to FIG. 5, a first conductive pillar 31 is formed in each of the at least one openings 301.

The first conductive pillar 31 is electrically coupled to the first conductive circuit layer 21. In one embodiment, the first conductive pillar 31 may be formed by plating copper in the opening 301. In other embodiments, a conductive material may be filled in the opening 301 to form the first conductive pillar 31.

Figure 6:
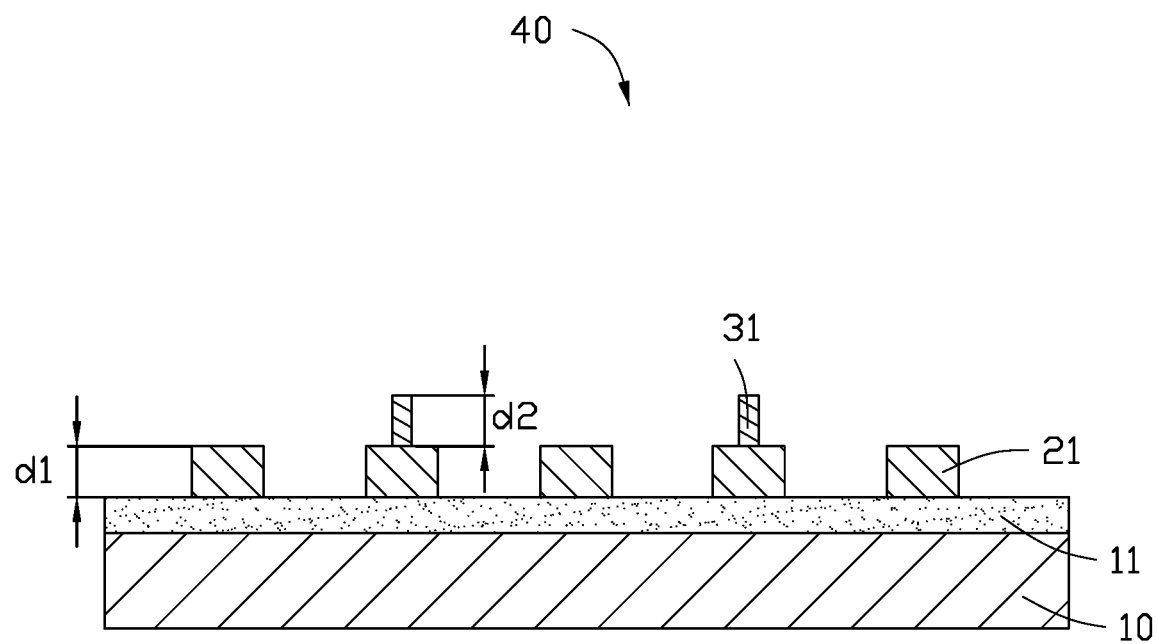
FIG. 6 is a schematic diagram of a structure after the dry film shown in FIG. 5 is removed.

In a sixth step, referring to FIG. 6, the dry film 30 is removed to obtain a first circuit substrate 40.

Figure 7:
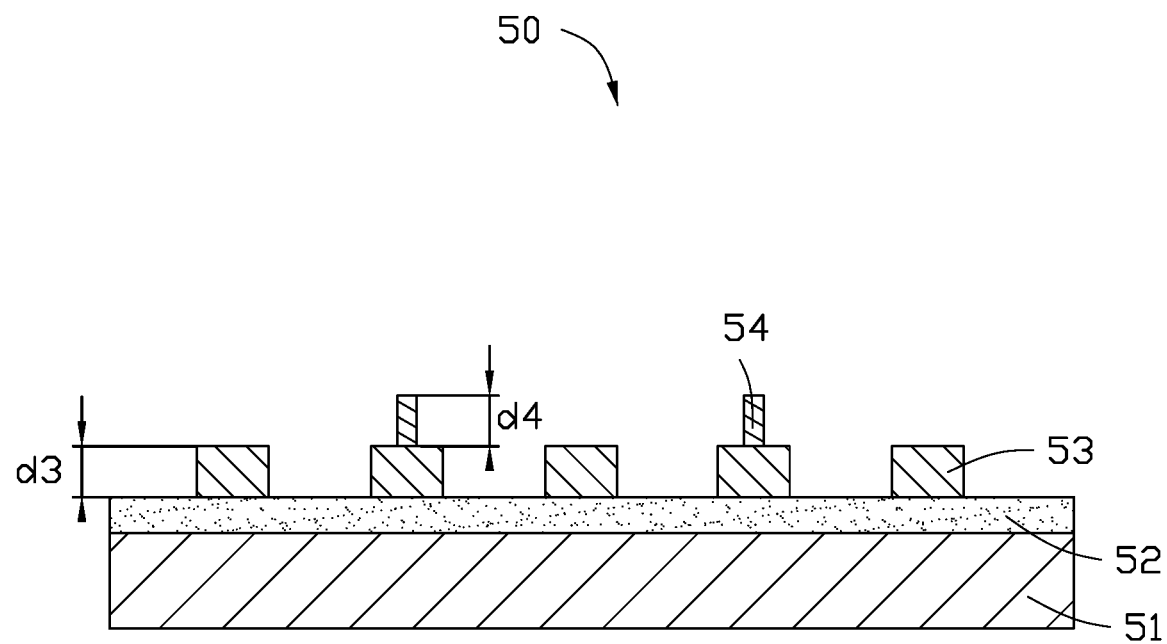
FIG. 7 is a schematic diagram of a second circuit substrate according to an embodiment of the present disclosure.

In a seventh step, referring to FIG. 7, a second circuit substrate 50 is provided.

The second circuit substrate 50 includes a second support board 51, a second peelable film 52, and a second conductive circuit layer 53.

In one embodiment, at least one second conductive pillar 54 is provided on the second conductive circuit layer 53, and the second conductive pillar 54 is electrically coupled to the second conductive circuit layer 53. A method of the second circuit substrate 50 is substantially the same as the method of the first circuit substrate 40.

It should be noted that, in another embodiment, the second conductive pillar 54 may be omitted.

Figure 8:
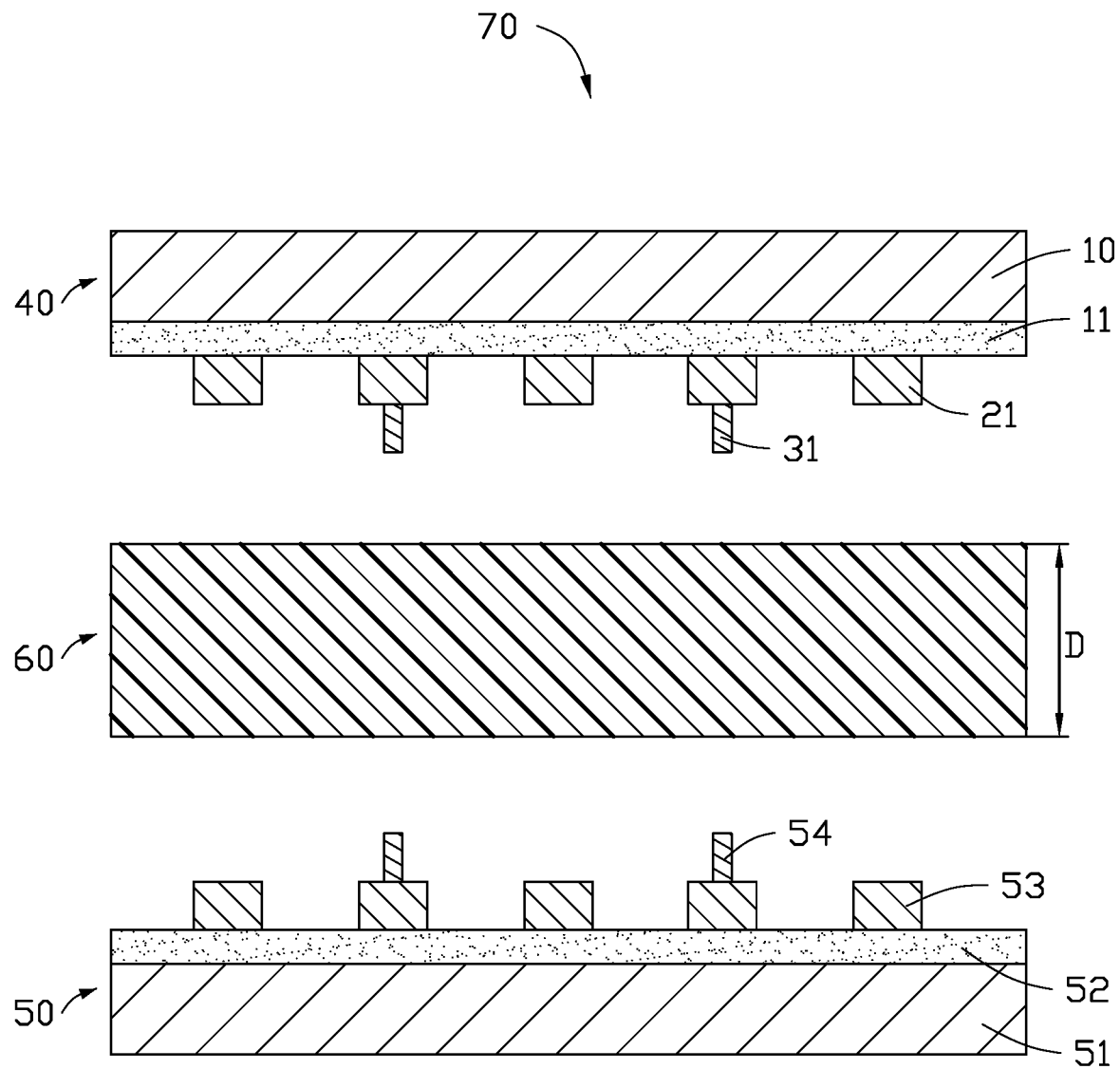
FIG. 8 is a schematic diagram of the first circuit substrate shown in FIG. 6, an insulating layer, and the second circuit substrate shown in FIG. 7 sequentially stacked.

In an eighth step, referring to FIG. 8, an insulating layer 60 is provided, and the first circuit substrate 40, the insulating layer 60, and the second circuit substrate 50 are sequentially stacked, so that the first conductive pillar 31 corresponds to the second conductive pillar 54, thereby obtaining an intermediate body 70.

A material of the insulating layer 60 can be selected from epoxy resin, polypropylene, bismaleimide triazine resin, polyphenylene oxide, polyimide, polyethylene terephthalate, thermoplastic polyimide, polyethylene naphthalate, and the like. In one embodiment, the material of the insulating layer 60 is polypropylene.

Figure 9:
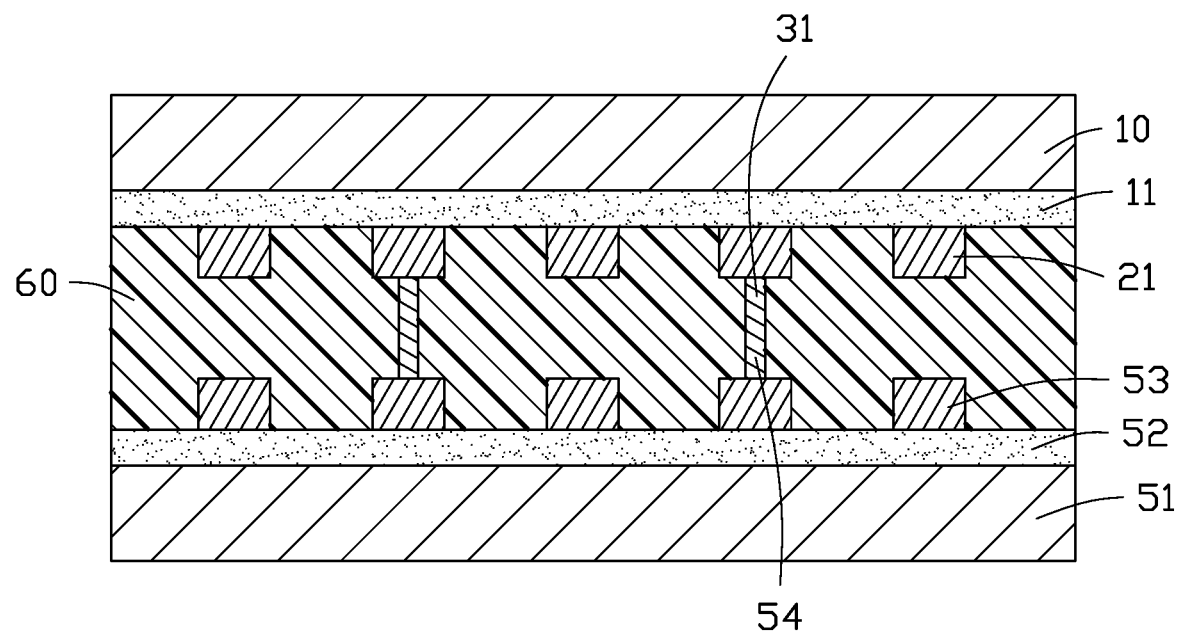
FIG. 9 is a schematic diagram of an intermediate body shown in FIG. 8 after being pressed.

In a ninth step, referring to FIG. 9, the intermediate body 70 is pressed, so that the first conductive pillar 31 and the second conductive pillar 54 pass through the insulating layer 60 and are electrically connected.

The first conductive circuit layer 21 and the second conductive circuit layer 53 can be electrically coupled through the first conductive pillar 31 and the second conductive pillar 54. It can be understood that when the second conductive pillar 54 is omitted from the second circuit substrate 50, a length of the first conductive pillar 31 is such that the first conductive pillar 31 passes through the insulating layer 60 during pressing to electrically coupled to the second conductive circuit layer 53. In this case, the first conductive circuit layer 21 and the second conductive circuit layer 53 can be electrically coupled through the first conductive pillar 31.

The first conductive circuit layer 21 and the second conductive circuit layer 53 are both embedded in the insulating layer 60.

Figure 10:
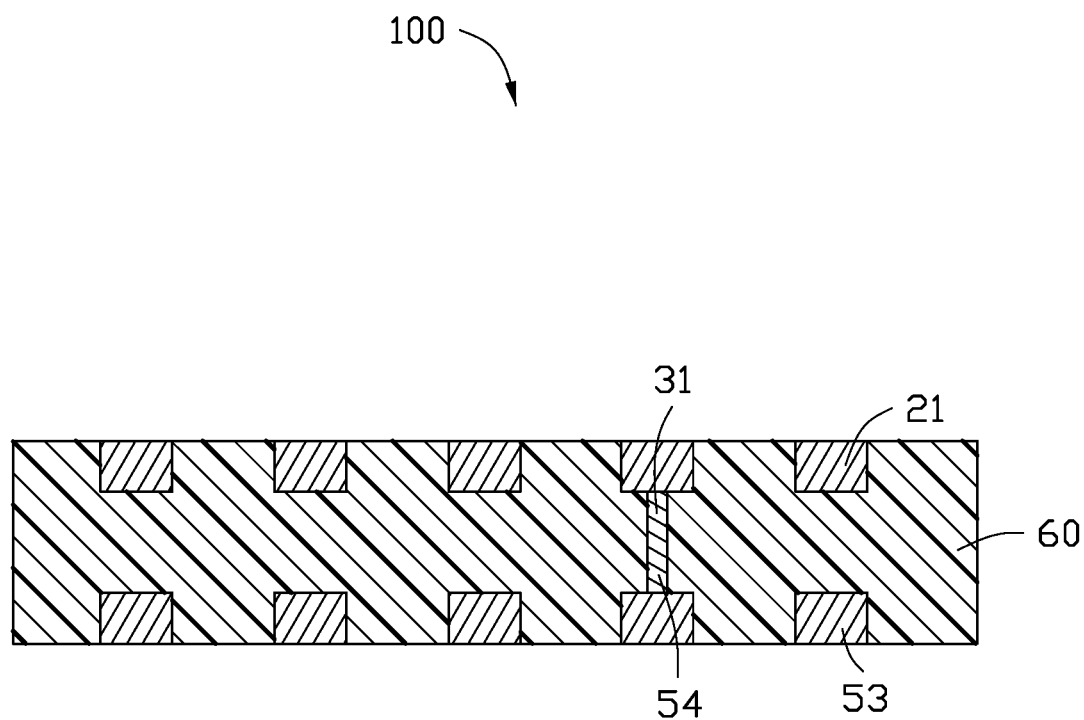
FIG. 10 is a schematic diagram of a circuit board with embedded conductive circuits obtained after removing the first support board, the first peelable film, the second support board, and the second peelable film shown in FIG. 9.

In a tenth step, referring to FIG. 10, the first support board 10, the first peelable film 11, the second support board 51, and the second peelable film 52 are removed to obtain a circuit board with embedded conductive circuits 100.

As shown in FIG. 6, the thickness of the first conductive circuit layer 21 is defined as d1, and the height of the first conductive pillar 31 is defined as d2. As shown in FIG. 7, the thickness of the second conductive circuit layer 53 is d3. The height of the second conductive pillar 54 is d4. As shown in FIG. 8, the thickness of the insulating layer 60 is D. In one embodiment, d1, d2, d3, and D may satisfy the following relationship: $D<(d1+d2+d3)<1.1\ D$. In another embodiment, d1, d2, d3, d4, and D may satisfy the following relationship: $D<(d1+d2+d3+d4)<1.1\ D$. As shown in FIG. 10, after pressing, the thickness of the insulating layer 60 is between 0.9 D and 1.1 D.

The first conductive paste layer 20 is formed on the first peelable film 11 of the first support board 10, and the first conductive paste layer 20 is exposed and developed to form the first conductive circuit layer 21. A second conductive paste layer is formed on the second peelable film 52 of the second support board 51, and the second conductive paste layer is exposed and developed to form the second conductive circuit layer 53. Compared with the related art, there is no need to form a seed layer and no subsequent etching process, thereby avoiding residual conductive materials to prevent short circuits between conductive lines.

The first conductive pillar 31 is formed on the first conductive circuit layer 21, and the second conductive pillar 54 is formed on the second conductive circuit layer 53. When the intermediate body 70 is pressed, the first conductive pillar 31 and the second conductive pillar 54 pass through the insulating layer 60 and are electrically coupled, which omits a laser drilling step, shortens the production time, and reduces the production cost.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A method for manufacturing a circuit board with embedded conductive circuits, the method comprising:
   providing a first support board, a first peelable film provided on one surface of the first support board;
   forming a first conductive paste layer on the first peelable film;
   etching the first conductive paste layer to form a first conductive circuit layer;

forming at least one first conductive pillar on the first conductive circuit layer, the first conductive pillar electrically coupled to the first conductive circuit layer, thereby obtaining a first circuit substrate;

providing a second support board, one surface of the second support board provided with a second peelable film;

forming a second conductive paste layer on the second peelable film;

etching the second conductive paste layer to form a second conductive circuit layer, thereby obtaining a second circuit substrate;

providing an insulating layer, and sequentially stacking the first circuit substrate, the insulating layer, and the second circuit substrate to obtain an intermediate body;

pressing the intermediate body so that the first conductive pillar passes through the insulating layer, the first conductive circuit layer and the second conductive circuit layer are electrically coupled through the first conductive pillar, and the first conductive circuit layer and the second conductive circuit layer embedded in the insulating layer; and removing the first carrier board, the first peelable film, the second carrier board, and the second peelable film, thereby obtaining the circuit board.

2. The method of claim 1, further comprising:

forming at least one second conductive pillar on the second conductive circuit layer, the second conductive pillar electrically coupled to the second conductive circuit layer; wherein:

the second conductive pillar passes through the insulating layer when the intermediate body is pressed and is electrically coupled to the first conductive pillar.

3. The method of claim 1, wherein a method of forming the first conductive pillar comprises:

forming a dry film on the first peelable film, the dry film covering the first conductive circuit layer, the dry film defining at least one opening, and a portion of the first conductive circuit layer revealed through the at least one opening;

forming the first conductive pillar in the at least one opening; and removing the dry film.

4. The method of claim 1, wherein:

the first conductive paste layer and the second conductive paste layer both comprise 5-20 parts of a photosensitive resin polymer, 5-20 parts of a self-drying resin polymer, 0.5-5 parts of a photopolymerization initiator, 40-80 parts of conductive material, and 2-15 parts of a curing crosslinking agent.

5. The method of claim 4, wherein:

the conductive material is at least one of silver particles, copper particles, graphene, and carbon nanotubes.

6. The method of claim 1, wherein:

a thickness of the first conductive circuit layer is defined as d1, a height of the first conductive pillar is d2, a thickness of the second conductive circuit layer is d3, and a thickness of the insulating layer before pressing is D; and d1, d2, d3, and D satisfy a relationship: $D<(d1+d2+d3)<1.1 D$.

7. The method of claim 2, wherein:

a thickness of the first conductive circuit layer is defined as d1, a height of the first conductive pillar is d2, a thickness of the second conductive circuit layer is d3, a height of the second conductive pillar is d4, and a thickness of the insulating layer before pressing is D; and d1, d2, d3, d4, and D satisfy a relationship: $D<(d1+d2+d3+d4)<1.1 D$.

8. The method of claim 1, wherein the insulating layer is made of at least one of polypropylene, epoxy resin, and polyimide.

9. A method for manufacturing a circuit board, comprising:

providing a first circuit substrate, the first circuit substrate comprising a first support board, a first peelable film provided on one surface of the first support board, a first conductive circuit layer on a surface of the first peelable film, and at least one first conductive pillar formed on the first conductive circuit layer, the first conductive pillar electrically coupled to the first conductive circuit layer;

providing a second circuit substrate, the second circuit substrate comprising a second support board, a second peelable film provided on one surface of the second support board, and a second conductive circuit layer on a surface of the first peelable film;

providing an insulating layer, and sequentially stacking the first circuit substrate, the insulating layer, and the second circuit substrate to obtain an intermediate body;

pressing the intermediate body so that the first conductive pillar passes through the insulating layer, the first conductive circuit layer and the second conductive circuit layer are electrically coupled through the first conductive pillar, and the first conductive circuit layer and the second conductive circuit layer are embedded in the insulating layer; and removing the first carrier board, the first peelable film, the second carrier board, and the second peelable film.

10. The method of claim 9, wherein a method of forming the first circuit substrate comprises:

forming a first conductive paste layer on the first peelable film;

exposing and developing the first conductive paste layer to form a first conductive circuit layer; and forming the at least one first conductive pillar on the first conductive circuit layer.

11. The method of claim 10, wherein a method of forming the second circuit substrate comprises:

forming a second conductive paste layer on the second peelable film; and exposing and developing the second conductive paste layer to form a second conductive circuit layer.

12. The method of claim 11, wherein the method of forming the second circuit substrate further comprises:

forming at least one second conductive pillar on the second conductive circuit layer, the second conductive pillar electrically coupled to the second conductive circuit layer.

* * * * *